United States Patent [19]

Gordon et al.

[11] 4,350,974

[45] Sep. 21, 1982

[54] LOGARITHMIC ANALOG-TO-DIGITAL CONVERTER

[75] Inventors: Bernard M. Gordon, Magnolia; Hans J. Weedon, Salem, both of Mass.

[73] Assignee: Analogic Corporation, Wakefield, Mass.

[21] Appl. No.: 140,662

[22] Filed: Apr. 15, 1980

Related U.S. Application Data

[63] Continuation of Ser. No. 836,158, Sep. 23, 1977.

[51] Int. Cl.³ .............................................. H03K 13/02
[52] U.S. Cl. ...................... 340/347 DA; 340/347 AD
[58] Field of Search ................. 340/347 AD, 347 DA

[56] References Cited

U.S. PATENT DOCUMENTS

| | | | |
|---|---|---|---|
| 3,187,323 | 6/1965 | Flood | 340/347 AD |
| 3,239,833 | 3/1966 | Gray | 340/347 AD |
| 3,525,948 | 8/1970 | Sherer | 340/347 AD UX |
| 3,533,098 | 10/1970 | Munoz | 340/347 AD |
| 3,544,993 | 12/1970 | Gabriel | 340/347 AD |
| 3,670,326 | 6/1972 | Sloane | 340/347 DA |
| 3,742,489 | 6/1973 | Lefevre | 340/347 AD |
| 3,997,892 | 12/1976 | Susset | 340/347 AD |

*Primary Examiner*—Charles D. Miller
*Attorney, Agent, or Firm*—Weingarten, Schurgin & Gagnebin

[57] ABSTRACT

A logarithmic analog-to-digital converter which provides a digital representation of the logarithm of the ratio of an input voltage and a reference voltage. The converter determines the ouptut via a successive approximation technique. The input voltage is amplified by selected ones from among a plurality of exponentially related gains; and the reference voltage is attenuated by selected ones of a set of exponentially related attenuation factors. The amplified input signal and the attenuated reference signal are compared, and the results of this comparison for a series of attenuations and/or amplification factors produces the desired logarithmic representation.

3 Claims, 4 Drawing Figures

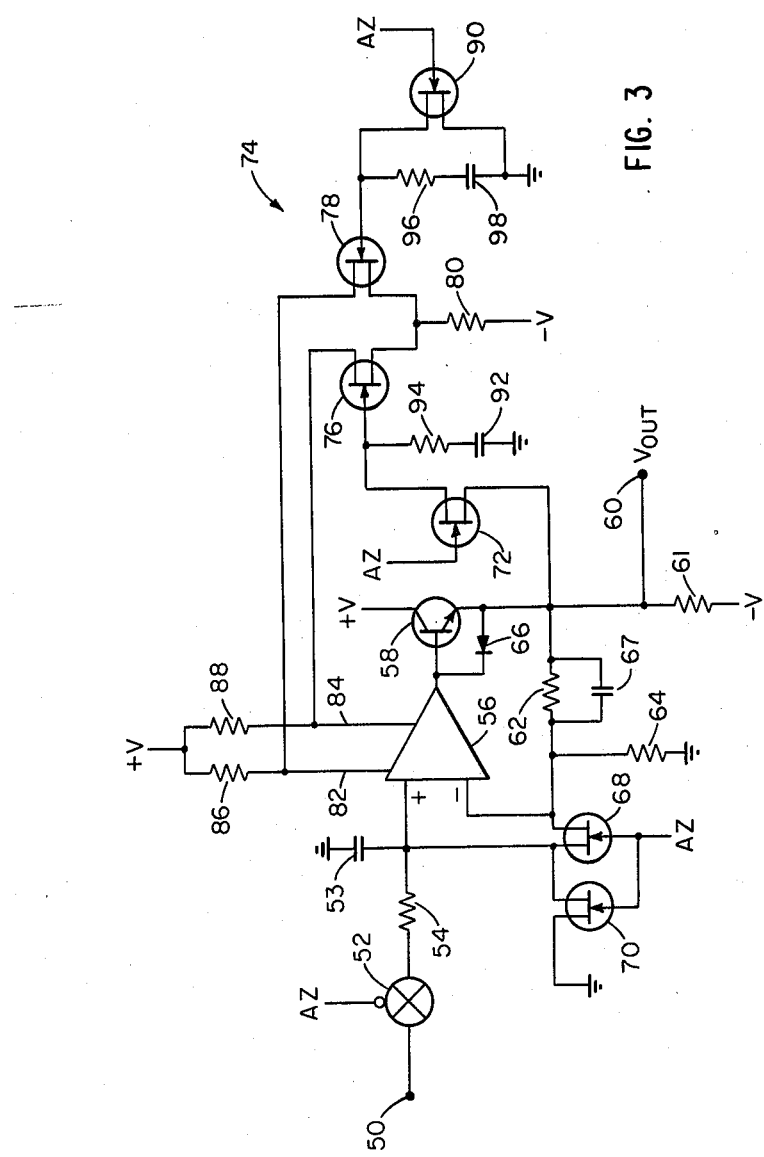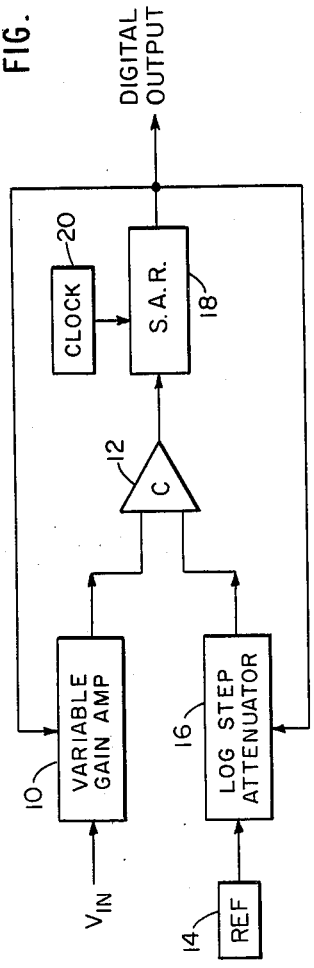

4,350,974

LOGARITHMIC ANALOG-TO-DIGITAL CONVERTER

This is a continuation of application Ser. No. 836,158, filed Sept. 23, 1977.

FIELD OF THE INVENTION

This invention relates to analog-to-digital converters, and more particularly to analog-to-digital converters in which the logarithm of an input signal is computed via a series of successive approximations.

BACKGROUND OF THE INVENTION

Linear analog-to-digital converters presently exist capable of meeting a wide range of operational specifications for use in different applications. Certain applications, however, pose requirements which are better met by logarithmic-types of analog-to-digital converters. Logarithmic converters frequently have advantages over linear converters in applications requiring a very large dynamic range and where the desired accuracy, and hence round-off error, is measured in terms of a specified percentage of the input signal rather than a specified percentage of the maximum output indicated by the converter.

Various techniques for performing logarithmic analog-to-digital conversions have been developed including techniques using the exponential decay with time of a voltage in an RC circuit, circuits in which the linear-to-logarithmic conversion is performed by utilizing the exponential characteristic of a semiconductor junction to perform an analog linear-to-logarithmic conversion which is then converted to digital form, piecewise-linear conversion techniques, and converters using cascaded amplifiers having exponentially related gains which may be switched into and out of a circuit for amplifying a reference voltage.

SUMMARY OF THE INVENTION

The present invention includes a logarithmic analog-to-digital converter which provides a digital representation of the logarithm of the ratio of an input voltage and a reference voltage. The converter determines the output via a successive approximation technique. The input voltage is amplified by selected ones from among a plurality of exponentially related gains; and the reference voltage is attenuated by selected ones of a set of exponentially related attenuation factors. The amplified input signal and the attenuated reference signal are compared, and the results of this comparison for a series of attenuations and/or amplification factors produces the desired logarithmic representation.

In a preferred embodiment of the present invention, an input signal is amplified via a plurality of gain stages having identical gains. The reference signal is attenuated via a logarithmic attenuator, including a unique logarithmic digital-to-analog converter implemented by providing feedback around a linear digital-to-analog converter.

DESCRIPTION OF THE DRAWINGS

The operation and advantages of the present invention will become more clear upon reading the following detailed description of the invention in conjunction with the accompanying figures of which:

FIG. 1 is a block diagram of the invention;

FIG. 3 is a schematic diagram of one implementation of an amplifier circuit shown in FIG. 2.

DETAILED DESCRIPTION OF THE INVENTION

Figure 2:
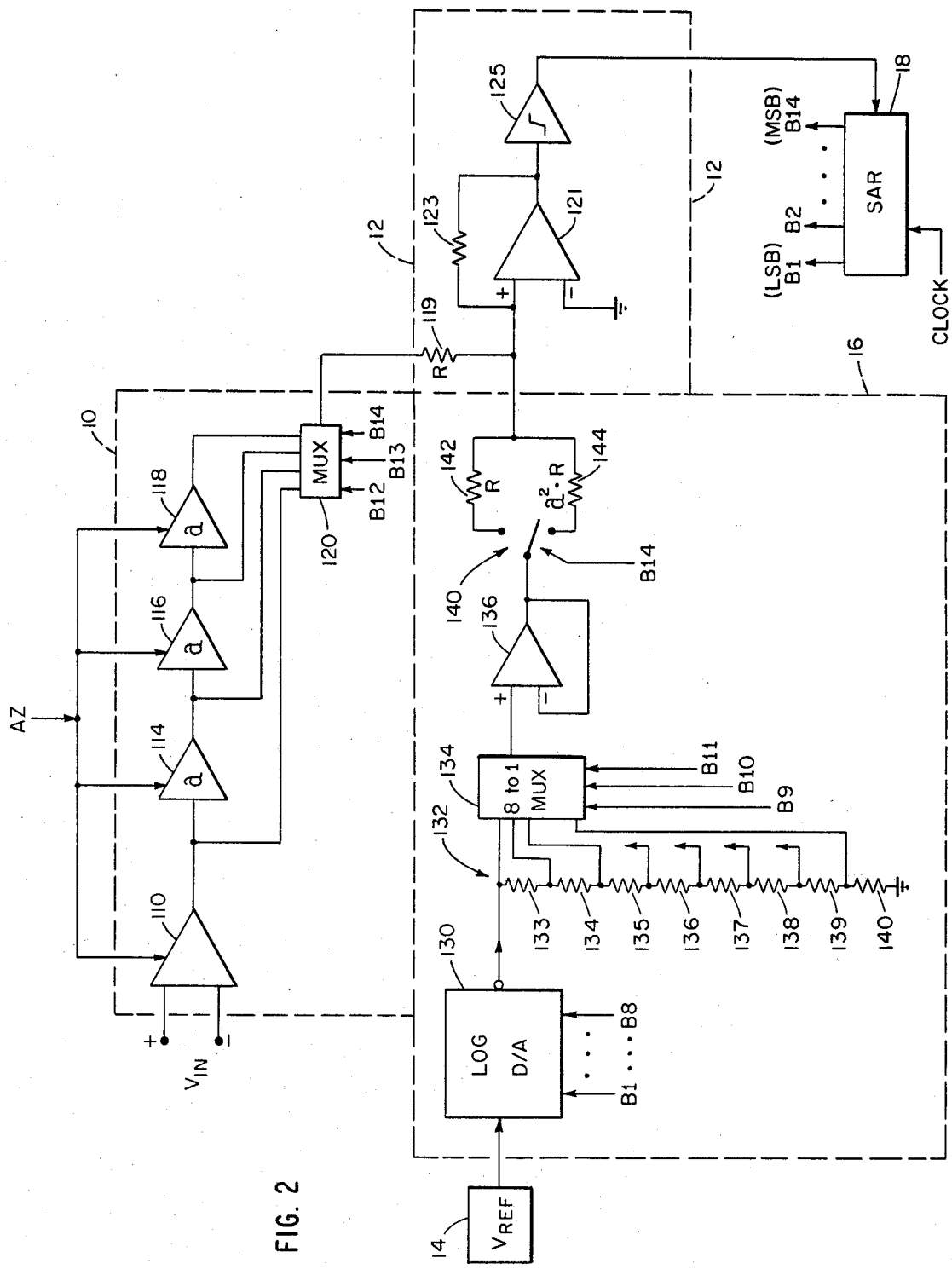
FIG. 2 is a schematic diagram of one particular embodiment of the present invention.

It will prove helpful in understanding the operation of the invention to briefly point out at this time the mathematical basis of the operation of the preferred embodiment described below. The application and importance of these principles will become apparent as the operation of the preferred embodiment is described with reference to the example given in Tables 1 and 2 below.

An unknown input voltage may be related to a known reference voltage by an equation of the type, $$V_{IN} = V_{REF} \cdot G^x \tag{1}$$

where G is a constant gain factor and x is a variable relating $V_{IN}$ to $V_{REF}$. Solving directly for x, the following equation is derived, $$x = C \cdot \log\left(\frac{V_{IN}}{V_{REF}}\right) \tag{2}$$

where C is a constant. Accordingly, x is proportional to the logarithm of the input voltage divided by the reference voltage.

This type of representation is useful in situations where an input voltage has a very large dynamic range with respect to the desired resolution. To take a specific example, an input signal will be assumed which ranges between 1 and 300,000, which is to be converted into a digital signal having an accuracy of 0.2% of the input signal. A linear A/D converter meeting these specifications would require approximately 27 bits. A logarithmic converter would require only 13 bits, as explained below:

A logarithmic converter would follow the equation, $$V_{IN}(1.002)^x = V_{REF} \tag{3}$$

where x takes on integral values. It can be seen that consecutive integral values of x will correspond with input signals differing by 0.2%, as required. For x ranging from 1 to 8.192 ($2^{13}$), input signals over a 1-to-300,000 range may be represented with an accuracy of 0.2%. Since the integral values of x between 1 and 8,192 may be represented by a 13-bit binary number, the logarithm of the input requires only 13 bits for an accuracy of 0.2%, in contrast with the 27 bits required by a linear D/A converter. Returning to equation (1), the term $G^x$ may be expanded as a product of terms as shown below:

$$G^x = \sum_{n=1}^{N} A^{a_n 2^n} \tag{4}$$

where A is a constant equal to $\sqrt{G}$, $a_n$ equals either 0 or 1, and n is an index variable ranging from 1 to N. Using the values of the previous example, N would equal 13 and any value of $G^x$ between 1 and 300,000 may be represented within 0.2% accuracy by the 13 coefficients $a_n$. This is shown more clearly when the product of equation (4) is expanded:

$$G^x = A^{a_1 \cdot 2^1} \times A^{a_2 \cdot 2^2} \ldots A^{a_N \cdot 2^N} \quad (5)$$

From equation (5), it can be seen that $G^x$ may be represented as:

$$G^x = A \sum_{n=1}^{N} a_n 2^n \quad (6)$$

Taking the logarithm of both sides, we find that:

$$x = C \sum_{n=1}^{N} a_n 2^n \quad (7)$$

where C is a constant. Thus, it can be seen that the value x may be represented by a binary number corresponding with the coefficients $a_n$.

While the above derivations and examples have been done for positive integral values of x and n, it should be clear that the derivation holds for negative integral powers of x as well.

Having explained the principles underlying the present invention and some of the advantages flowing therefrom, the construction and operation of the novel converter are now described.

Referring to FIG. 1, there is shown a simplified block diagram of the present invention. An input voltage $V_{IN}$ of unknown magnitude is applied to a variable gain amplifier 10. Variable gain amplifier 10 has a plurality of discrete values of gain which are exponentially related, and which are selected in response to a digital input. The output from variable gain amplifier 10 is applied to a comparator 12. A reference source 14 provides a precision reference signal to a log step attenuator 16. In response to a digital input signal, attenuator 16 produces the magnitude of the input signal from reference 14 by one of a plurality of exponentially related ratios to provide an output signal. This output signal is applied to the second input of comparator 12.

The output of comparator 12 is indicative of the relative magnitude of the two input signals. The comparator output signal is applied to a successive approximation register 18. The successive approximation register 18 may be of conventional design, and one commercially available successive approximation register suitable for use with the present invention is the AM2-5LO3. A clock signal is also applied to successive approximation register 18.

The operation of the circuit shown in FIG. 1 can perhaps be explained most clearly by taking a particular example. Using the example cited before with reference to equation (3), an input signal will be assumed which ranges between 1 and 300,000, and this signal is to be converted to a digital signal having an accuracy of 0.2% of the input signal.

As stated above, such a logarithmic converter requires 13 bits. Referring to Table 1, there are shown the different gains and/or attenuations which must be realized by variable gain amplifier 10 and/or attenuator 16 in performing the analog-to-digital conversion. Referring to equations (1) and (3), it should be clear that amplification of the input by one or more of a series of exponentially related factors is exactly equivalent to dividing the reference by the same set of exponentially related factors. Therefore, for this explanation, only gain factors will be referred to. However, it should be appreciated that either gain or attenuation may be used.

The left-most column in Table 1, labeled "n," denotes the number of the bits—bit 13 being the most significant bit. Column 2, labeled "$2^n$," denotes the value of $2^n$, which value is the exponent of the basic value of gain "A" in accordance with equations (4) through (6). The third column, labeled "$A^{2^n}$," gives the different gain values corresponding with each of the bits in the digital output.

It should be noted that the reference voltage and the gain values are not independent parameters. Doubling the reference voltage is the equivalent of doubling the different values of gain. Therefore, this example will assume a reference voltage of 1 for convenience.

The multiplication of each of the 13 values of gain shown in Table 1 produces a product of 300,000.0. Thus, by selecting the proper factors from the gain shown in Table 1, any value from 1 through 300,000 may be derived. Since the smallest factor equals 1.0015, the final product will be within the required 0.2% of the desired value. This is demonstrated in the examples given below. The right-hand portion of Table 1 lists three exemplary input values: 10, 1,000, and 100,000. The 1's and 0's beneath each value correspond with the digital logarithmic value produced by the circuit of FIG. 1.

For example, if the input $V_{IN}$ to comparator 12 has a value of 10, the converter shown in FIG. 1 operates in the following manner. To begin, the digital outputs of the successive approximation register are reset to 0. During the first cycle, the successive approximation register 18 sets the first bit to 1 to test it; and in response, variable gain amplifier 10 multiplies the unity reference voltage by the corresponding value of gain, 547.72, as shown in Table 1. Comparator 12 indicates that the output from variable gain stage 10 exceeds the input, and the most significant bit of the output is set to 0 by successive approximations register 18. Next, successive approximation register 18 sets the second most significant bit to 1, causing variable gain stage 10 to select the next largest gain. The same procedure is repeated for the second value of gain, 23.40; and the second most significant bit of the digital output is set to 0.

During the third cycle, the gain of amplifier 10 is 4.84, and comparator 12 indicates that the output from amplifier 10 exceeds the reference voltage. In response to this output from the comparator, successive approximation register 18 sets the third most significant bit to 1. During the fourth cycle, the third bit remains set to 1, and the fourth bit is set to 1 to test it. This sets the gain of variable gain stage 10 equal to 4.84×2.20, the previously determined value corresponding with the third most significant bit, multiplied by the fourth value of gain, resulting in a gain of 10.64. Comparator 14 indicates that this output exceeds the reference voltage, and the fourth most significant bit in the output is set to 0, as shown in Table 1. During the fifth cycle, the input voltage is amplified by 4.84 (the gain of the 3rd bit) multiplied by the next test value of gain 1.48. This produces an output from amplifier 10 of 7.16. Comparator 12 indicates that this output exceeds the reference voltage; and successive approximation register 18 sets the fifth bit of the output to 1.

This procedure is repeated until all 13 bits of the output have been determined. The resulting digital output is representative of the logarithm of the input voltage. Multiplying the different gain factors indicated by 1's in the output shown in Table 1 produces a value of 9.9896, which agrees with the input voltage of 10 to within 0.11%. The two remaining right-most columns in Table 1 shows the logarithmic output produced by the circuit of FIG. 1 for inputs of 1,000 and 100,000; and below these outputs is shown the actual value denoted by the digital output. It can be seen that these output values are all within the specified 0.2% accuracy.

While Table 1 presents a specific example, it should be clear that other values of A and other ranges of n may be used. In particular, by using an integral power of e for A, the digital output produced is the natural logarithm of the input. Furthermore, it should be apparent that these smaller values of gain for variable gain stage 10 need not be reaised to positive powers: negative powers will work equally well. Table 2 is exemplary of such a sequence of gains.

Referring to FIG. 2, there is shown one preferred embodiment of the present invention. The logarithmic converter is a 14-bit converter which calculates the value log ($V_{REF}/V_{IN}$). Full scale occurs when $V_{IN}$ is at its smallest value; and the converter full scale output is limited to 101 111 111 111 11.

An input signal, shown as $V_{IN}$ in FIG. 2, is applied to a differential input amplifier 110. Differential amplifier 110 converts the differential input voltage $V_{IN}$ to a single-ended voltage with respect to ground, which results in simpler circuitry in the rest of the converter. Amplifier 110 also provides buffering of the input signal and may provide some gain if desired. To reach the full potential of the present invention, it is important that errors in the circuitry be kept to a minimum. Typically, input differential amplifier 110 is of a type which can perform an autozero cycle to compensate for input offset voltage drift and other errors in the input amplifier circuit. Accordingly, an autozero (AZ) signal is applied to amplifier 110; and in response to the AZ signal going high, indicating that an autozero cycle is to be performed, input differential amplifier will perform an autozero cycle. One differential amplifier which has been found to be suitable for use as the input amplifier 110 to the logarithmic A/D converter is described in detail in a copending application entitled "Low-Noise Differential Amplifier" by Bernard M. Gordon, filed concurrently with the present application.

The output from input amplifier 110 is applied to a plurality of following amplifier stages connected in series. In the embodiment shown in FIG. 2, three separate amplifier stages are used, denoted as amplifiers 114, 116, and 118. Amplifiers 114–118 are precision amplifiers whose gain is very precisely determined. The gains of each of these amplifiers are identical and will be denoted as a. In the embodiment described herein, this gain is 1.25 to the eighth power [$(1.25)^8$] or 5.960464478, ±0.002%. One particular amplifier circuit suitable for use as amplifier stages 114–118 is shown and described in more detail below with reference to FIG. 3.

The output signals from input amplifier 110 and from amplifiers 114–118 are applied to a four-channel to one-channel multiplexer 120. Since the gain of each of the amplifier stages is a, the four inputs to multiplexer 20 will be related by successive integral powers of a. Thus, if the output from input amplifier 110 is normalized to equal 1 in value, the output from amplifier 114 will equal a, the output from amplifier 116 will equal $a^2$, and the output from amplifier 118 will equal $a^3$. Multiplexer 20 is controlled by the three most significant bits, denoted as B0, B1, and B2, from successive approximation register 18. In response to signals from register 18, multiplexer 120 selects one signal from among the four input signals and applies this selected signal to one input of a comparator 12 via a resistor 119 having a value R. Comparator 12 includes an input amplifier, made up of op-amp 121 and resistor 123, followed by a high gain stage 125 to provide a digital output. Comparator 12 may also be of the type which performs autozeroing to compensate for drifts in offset errors.

The logarithmic attenuator 16 is shown within dotted box 16 in FIG. 2. The input to attenuator 16 comes from a precision voltage reference source 14. The voltage from voltage reference source 14 is applied to a logarithmic digital-to-analog converter 130. The eight least significant bits from successive approximation register 18, B8 through B1, are applied to log D/A 130; and in response, log D/A 130 provides an output voltage proportional to the anti-log of the digital input. One means of implementing D/A converter 130 is shown and described in detail below in connection with FIG. 4. The output stage of converter 130 is an inverter, and thus, the output from converter 130 will be a negative voltage.

The output from D/A converter 130 is applied to a resistive divider 132. Resistive divider 132 includes eight resistors 133 through 140 connected in series between the output from converter 130 and ground. The output from converter 130 and the outputs from each of the junctions of the resistors in resistive divider 132 are applied to an 8 to 1 analog multiplexer 134. The output from analog multiplexer is controlled by three bits, B9 through B11, from successive approximation register 18. By properly choosing the values of resistive divider 132, the voltage output from converter 130 is further attenuated by the appropriate factor, depending on the digital output from successive approximation register 18. The output from multiplexer 134 is applied to a unity gain buffer amplifier made up of op-amp 136.

The output of op-amp 136 is applied to a switch 140 which is controlled by the most significant bit B13 from successive approximation register 18. In response to the value of the most significant bit, B14, the output from op-amp 136 is applied to the input of comparator 12 via one of two resistors 142 and 144. The ratio between resistors 142 and 144 is equal to $a^2$, where a is equal to the amplification factor of amplifiers 114–118. The reason for this ratio is explained below.

The amplified input voltage provided at the output of multiplexer 120 and the attenuated reference voltage provided at the output of op-amp 136 are applied to the ends of a voltage divider composed of resistor 119 and either resistor 142 or resistor 144, depending on the value of the B0 output from register 18. Due to the above-described inversion of the attenuated reference voltage, it can be seen that if resistor 142 is selected by switch 140, the relative magnitude of the input voltage and the attenuated reference voltage will be indicated by whether the connection of resistors 110 and 142, and thus the input to op-amp 121, is positive or negative. If switch 140 selects resistor 144, it can be seen that this is effectively an attenuation of the reference voltage by a factor of $a^2$. The reasons for having switch 140 and resistors 142 and 144 included in the circuit are explained below.

To begin a conversion, the outputs from successive approximation register 18 are all reset to 0, selecting minimum gain and attenuation, and the most significant bit, B14, is set to 1 to test the first bit. In response to B14 being 1 and B13 and B12 being 0, multiplexer 120 selects the output from amplifier 116, which has an amplification factor of $a^2$. In response to B14 being 1, switch 140 in attenuator 16 applies the output from op-amp 136 to resistor 144. This results in an attenuation of $1/a^2$ of the reference signal. The net result is that the effective gain is $a^4$. If the output from comparator 12 indicates that the amplified input voltage is less than the attenuated reference voltage, B14 is set to 1, and the converter proceeds to determine the next bit. As stated above, the converter shown in FIG. 2 has a full scale output of 101 111 111 111 11. Thus, if B14 equals 1, B13 will always equal 0.

If the amplified input voltage is greater than the reference voltage, as determined by comparator 12, B14 is set to 0, and successive approximation register 18 next tests the second most significant bit, B13. Switch 140 selects resistor 142 in response to the 0 value for B13, and multiplexer 120 again selects $a^2$ output from amplifier 116 in response to the input from successive approximation register 18. The output from comparator 12 indicates the relative magnitudes of the amplified input signal and the attenuated reference signal, and B13 is set accordingly. Next, B12 is similarly tested, and the three most significant bits have been determined by the converter circuitry. The operation of multiplexer 120 and switch 140 in response to different values of the three most significant bits is summarized in Table 3.

These three bits are determined as described above to maintain the highest possible signal-to-noise ratio at the input to comparator 12. It is desirable to have maximum amplification of the input signal so that the signal level at the input to comparator 12 is as high as possible. As can be seen from Table 3, the sequence described above insures that for small values of $V_{IN}$, a high value of amplification for $V_{IN}$ is provided which results in a high signal level to the input of comparator 12, rather than a high value of attenuation, which would result in a lower signal level at the input to comparator 12. This procedure need only be carried out for the first several most significant bits, since these bits correspond to amplification factors much greater than the amplification factors corresponding with the lower order bits.

After the three most significant bits, B14-B12, have been determined, the converter next determines the remaining 11 least most significant bits. In the embodiment shown in FIG. 2, the next three bits, B11-B9, select different attenuation factors as determined by resistive ladder network 132, described above. The eight least significant bits, B8-B1, are applied to D/A converter 130, described below, which provides the proper output in response thereto. After all 14 bits have been determined, the digital output from successive approximation register 18 corresponds to the binary logarithm of the input voltage.

The precision amplifiers 14, 16 and 18 shown in FIG. 2 and described above, may be implemented by means of many different circuits. However, one novel circuit which has been found to be particularly suitable for use with the present invention is shown in FIG. 3 and described below.

An input signal is applied to an input terminal 50 to the amplifier stage. This input signal is applied via a switch 52 and resistor 54 to the non-inverting input of an op-amp 56, connected as a non-inverting amplifier. One op-amp suitable for use as amplifier 56 is a 356 type op-amp. The output from op-amp 56 is applied to the base of a transistor 58. Transistor 58 is connected as an emitter follower, and the output from the amplifier shown in FIG. 2 is taken from the emitter of transistor 58 at terminal 60, as shown. The inverting input of op-amp 56 is connected to ground via resistor 64 and is connected to the emitter of transistor 58 via resistor 62. These resistors provide negative feedback, and the ratios of these resistors determine the gain of the amplifier stage. Capacitor 53 and 63 determine the frequency response of the amplifier.

Transistor 58 is optional and provides for higher output current from the amplifier circuit to drive multiplexer 120 in response to rapid positive increases in the output voltage. A diode 66 is connected between the output terminal 60 and the output of op-amp 56 to provide for negative changes in the output voltage from op-amp 56.

The remaining circuitry shown in FIG. 3 provides the autozero functions of the amplifier. To begin an autozero cycle, the AZ signal goes high. This signal is applied to switch 52, causing it to open and disconnecting the input signal applied to terminal 50 from the amplifier circuitry. The AZ signal is also applied to two FET switches 68 and 70, causing these switches to go from the non-conductive state to the conductive state. When switch 68 is in the conductive state, it shorts the inverting and non-inverting inputs of op-amp 56, disabling the negative feedback around the op-amp; and thus op-amp 56 operates effectively open-loop during the autozero cycle. With the inputs to op-amp 56 shorted, the input offset voltage of op-amp 56 is amplified by the open-loop gain of the op-amp, and this amplified offset voltage appears at output terminal 60. FET switch 70 clamps the shorted inputs of op-amp 56 to ground during the autozero cycle.

The high AZ signal also causes a FET switch 72 to conduct; and the amplified offset voltage of op-amp 56 is applied to offset correction amplifier circuitry 74 via FET 72. Amplifier 74 is composed of two FET's connected as a source-coupled, differential amplifier. The source terminals of FET's 76 and 78 are connected to a negative voltage via a resistor 80. The drains of FET's 76 and 78 are respectively connected to the two input offset voltage correction terminals 82 and 84 to op-amp 56. The offset correction terminals 82 and 84 are connected to a positive voltage, typically 15 volts, via resistors 86 and 88.

The offset correction to amplifier 56 is effectuated by providing slightly different currents and/or voltages at terminals 82 and 84. Normally, this is accomplished by means of a potentiometer connected in place of resistors 86 and 88 with its wiper connected to the positive voltage. However, such an arrangement provides a fixed offset correction and does not compensate for drifts in the offset voltage. The circuit shown in FIG. 2 allows input offset corrections which correct for drift to be made via the offset correction terminals of op-amp 56. This has several advantages over previous methods of providing offset drift correction. First, the circuitry required in the input circuits to the op-amp is simplified. This results in fewer error-producing active components in the signal path and thereby reduces errors in the overall amplifier circuitry. Additionally, drift correction provided at the offset compensation terminals of an operational amplifier sometimes results in a lower temperature coefficient for the drift voltage. This results from the fact that the op-amp is specifically designed to be compensated by signals present at these terminals; and many op-amps are designed so as to result in minimal drift when an offset voltage is nulled at these terminals, rather than by means of a compensating voltage applied to an input.

Offset correction amplifier 74 operates as follows. The gate to FET 78 is connected to ground during the autozero period via a FET switch 90. During the autozero period, the offset voltage from op-amp 56 amplified by the gain of op-amp 56 is applied to the gate of FET 76 via FET switch 72. This voltage is amplified by the FET differential amplifier 74 and applied to the offset correction pins of op-amp 56 with a polarity such that the offset voltage tends to be nulled. The high gain of op-amp 56 causes the input voltage to FET 76 to go to a value which compensates for the offset input voltage to the op-amp. A capacitor 92 is connected to the gate of FET 76 via a resistor 94. The voltage present at the gate of FEt 76 during the autozero cycle is stored on capacitor 92 and causes compensation amplifier 74 to continue to correct for the offset voltage between autozero cycles. The gate of FET 78 is connected to ground via resistor 96 and capacitor 98, which are respectively equal in value to resistor 94 and capacitor 92. At the end of the autozero period, the AZ signal goes low. Any transient coupled through FET switch 72 into the gate circuit of FET 76 will be cancelled by an identical transient coupled through FET switch 90 to the gate circuit of FET 78. Due to leakage current in the gate circuit of FET 76, the voltage applied thereto may tend to drift between autozero periods due to the slow discharging of capacitor 92 and also due to any voltage drop which might occur across resistor 94 due to such leakage current. However, since the gate circuits of FET's 76 and 78 are equal, the drift in the gate voltages to these two FET's will be identical, and the differential voltage will remain the same. Thus, these error sources will cancel.

The following values have been found suitable for use with the amplifier circuit of FIG. 2 and result in an amplifier having gain of 5.95 and a settling time of approximately 12 microseconds.

| 53 | 680pF   | 80 | 240kΩ  |
|----|---------|----|--------|
| 54 | 560Ω    | 86 | 10kΩ   |
| 61 | 4.7kΩ   | 88 | 10kΩ   |
| 62 | 4.95kΩ  | 92 | 0.1μF  |
| 63 | 100pF   | 94 | 330Ω   |
| 64 | 1KΩ     | 96 | 330Ω   |
|    |         | 98 | 0.1μF  |

Figure 4:
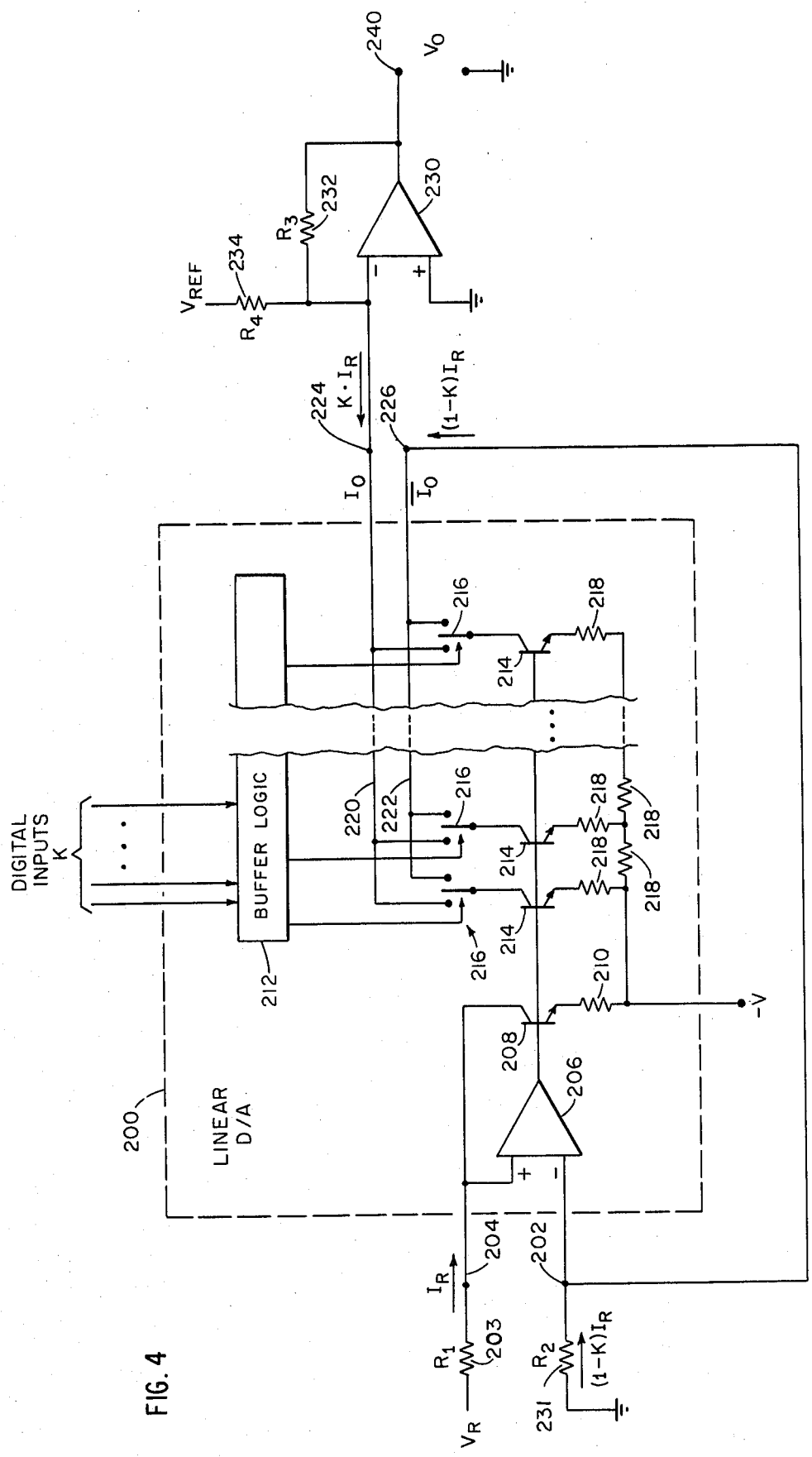
FIG. 4 is a schematic diagram of the novel logarithmic digital-to-analog converter shown in FIG. 2.

As shown in FIG. 2 and explained above, the least significant eight bits from successive approximation register 18 are applied to a logarithmic digital-to-analog converter 130 which attenuates the reference signal by the proper value to provide an output signal representative of the anti-log of the eight least significant bits. One particularly useful implementation of logarithmic D/A converter 130 is shown in FIG. 4 and described below. In this implementation, a linear D/A converter of a well-known type is used. The digital inputs from successive approximation register 18 are applied to the digital inputs of the linear converter. By means of feedback around the linear converter, the output thereof is modified such that it becomes parabolic rather than linear. Although the parabolic transfer function does not exactly equal a logarithmic transfer function, for changes in the output over a small range, proper selection of the parameters controlling the feedback around the converter allows the parabolic output to approximate a logarithmic curve within approximately 0.004%.

Referring to FIG. 4, the operation of the circuit will now be described. The heart of the circuit is a conventional linear digital-to-analog converter shown within dotted box 200. Such converters are commercially available; and one exemplary circuit is a Precision Monolithics DAC-08. The linear D/A converter 200 operates in the following manner. When used as a linear converter a reference voltage $V_R$ is applied via a resistor 202 having a value $R_1$ to an input 204 to the converter 200. Input 204 is connected to the inverting input of an op-amp 206 contained within the converter. The output of op-amp 206 is applied to the base terminal of a transistor 208 whose collector is connected to the inverting input of op-amp 206. The emitter terminal of transistor 208 is connected to a negative voltage via a resistor 210. Normally, when used as a linear converter, the converter input terminal 202, connected to the non-inverting input of op-amp 206, is connected to ground. The output of op-amp 206 is inverted by transistor 208, and the negative feedback applied to the non-inverting input of op-amp 206 from the collector of transistor 208 tends to keep the non-inverting input of op-amp 206 at the same voltage as the inverting input thereof. Thus, the current $I_R$ through resistor 202 is determined by the reference voltage $V_R$ and the value $R_1$ of resistor 202. This reference current $I_R$ is kept constant by the operation of op-amp 206.

The digital inputs to D/A converter 200 are applied to buffer logic 212. In the embodiment described herein, there are eight digital inputs to converter 200. Associated with each of these digital inputs is a corresponding transistor 214 and associated switch 216 connected to the collector thereof. As described below, each of the transistors 214 has a current flowing therethrough which is proportional to the binary weight of the associated digital input. This proportional current is determined by resistors 218 and the voltage applied to the bases of transistors 214 from the output of op-amp 206. In response to the binary 1's and 0's applied to the digital inputs of the converter, switches 216 switch the currents from each of the transistors to one of two buses 220 and 222. These buses are respectively connected to output terminals 224 and 226 of the converter. Thus, the sum of the current into terminals 224 and 226 will be a constant value. The current into input terminal 224 is denoted as $I_O$ and is proportional to the value of the digital inputs. The current into terminal 226 is the complement of the current into terminal 224 and is denoted as $\overline{I_O}$.

The geometry and characteristics of transistor 214 and transistor 208 are very carefully controlled and matched, and the connection of the base of transistor 208 with the bases of transistors 214 causes the collector currents in transistors 214 to be proportional to the collector current in transistor 208. Generally, this proportionality is such that the sum of the collector currents of transistors 214 is equal to the collector current $I_R$ of transistor 208. As described above, the collector current of transistor 208 is determined by the voltage drop across resistor 203. In normal operation, with input terminal 202 grounded, this voltage is dependent only upon the reference voltage. Thus, the output current $I_O$ of converter 200 is equal to $K \cdot I_R$, where K represents the normalized digital input and is taken to vary between 0 and 1. The inverse output $\overline{I_O}$ equals $(1-K)I_R$.

To provide the non-linear output required of the logarithmic D/A converter 130, the normally grounded input terminal 202 is connected to ground through a resistor 231 having a value R₂, and the complementary output $\bar{I}_O$ of converter 200 at terminal 226 is connected to terminal 202. Thus, a current $(1-K)I_R$ flows through resistor 231, causing a voltage drop thereacross, and the voltage at input terminal 202 will differ from ground. Since op-amp 206 will force input terminal 204 to be at the same voltage as input terminal 202, the voltage drop across resistor $R_1$ and hence the reference current $I_R$, will be effected by the feedback from the complementary output of the converter. As will be shown below, by proper selection of the values of resistors $R_1$ through $R_4$, the output may be made to approximate very closely the desired logarithmic curve.

The output current from converter 200 is applied to the input of an op-amp 230. A resistor 232 having a value $R_3$ connects the output of op-amp 230 with its inverting input. The reference voltage is also applied to the inverting input of op-amp 230 via a resistor 234 having a value $R_4$. Thus, the output voltage of op-amp 230 is determined by the sum of the current through $R_4$ and the output current from converter 200. This output voltage from op-amp 230 is the output voltage of the logarithmic digital-to-analog converter. It should be noted that due to the inverting configuration of op-amp 230, this voltage will vary in a negative direction with respect to ground.

The reference current $I_R$ through resistor 202 is given by the following equation:

$$I_R = \frac{V_R + (1-K)I_R R_2}{R_1} \quad (8)$$

The output voltage of the converter (ignoring the sign change caused by the inversion of op-amp 230) is given by:

$$V_O = R_3\left(KI_R - \frac{V_R}{R_4}\right) \quad (9)$$

Setting $R_3$ equal to $R_4$ for convenience and combining equations (8) and (9), the result is:

$$\frac{V_O}{V_R} = \left[1 - \frac{KR_3}{R_1 - (1-K)R_2}\right] \quad (10)$$

The values selected for $R_1$, $R_2$, and $R_3$ will be determined by the curve that it is desired to fit. An exemplary calculation will be performed for the logarithmic analog-to-digital converter shown in FIG. 2. The minimum attenuation required is no attenuation, or unity gain, when the digital input is equal to its minimum value, or K=0. By inspection of equation (10), it can be seen that the transfer function $V_O/V_R=1$ is always satisfied for K=0.

The maximum attenuation required is equal to $a^8$, where a is the gain of the amplifier stages 114–118. (The values between a and $a^8$ are provided by resistive divider 132.) Since the gain a of these amplifiers was specified to be $(1.25)^8$, the maximum attenuation from logarithmic D/A converter 130 is 1/1.25 or 0.8. The maximum attenuation is required for the maximum digital input, or for K=1. Plugging these values into equation (10) gives:

$$\frac{V_O}{V_R} = 0.8 = 1 - \frac{R_3}{R_1} \quad (11)$$

$$\frac{R_3}{R_1} = 0.2 \quad (12)$$

Equation (12) may be satisfied by selecting 10K for $R_1$ and 2K for $R_3$. There remains one parameter, $R_2$, to select to determine the shape of the curve. The minimum error is obtained if the center point of the logarithmic attenuation curve desired is set exactly equal to the converter output. The attenuation required in the center point of this curve will be equal to the square root of the maximum attenuation. This follows from equation (4). Thus, from the above-determined values and equation (10), the following equation may be written to define the value of $R_2$:

$$\sqrt{0.8} = 1 - \frac{1/2 \cdot 2K}{10K - 1/2R} \quad (13)$$

Solving equation (13), the value of $R_2$ is found to be: $R_2 = 1.055728$ kilohms.

Referring to Table 4, the exact values of the desired logarithmic attenuation curve are compared with the actual values given by the circuit of FIG. 4 with the values previously calculated. It can be seen that the maximum error is less than 0.005% which provides sufficient accuracy for the 14-bit converter described above and shown in FIG. 2.

There has been described a novel logarithmic analog-to-digital converter including a plurality of sub-circuits, all of which provide many advantages over circuitry known. It should be recognized that the preferred embodiment described herein may be modified by those of ordinary skill in the art in applying the teachings of the present invention to different applications. Accordingly, the present invention is to be limited only as indicated by the appended claims.

TABLE 1

| n | $2^n$ | $A^{2^n}$ | 10 | 1000 | 100000 |
|---|---|---|---|---|---|
| 1 | 2 | 1.0015 | 1 | 1 | 0 |
| 2 | 4 | 1.0031 | 1 | 1 | 1 |
| 3 | 8 | 1.0062 | 1 | 1 | 1 |
| 4 | 16 | 1.0124 | 0 | 0 | 0 |
| 5 | 32 | 1.0250 | 1 | 0 | 1 |
| 6 | 64 | 1.0505 | 0 | 0 | 1 |
| 7 | 128 | 1.1035 | 1 | 0 | 0 |
| 8 | 256 | 1.2178 | 1 | 1 | 0 |
| 9 | 512 | 1.4830 | 1 | 1 | 1 |
| 10 | 1024 | 2.1994 | 0 | 0 | 0 |
| 11 | 2048 | 4.8377 | 1 | 0 | 1 |
| 12 | 4096 | 23.4034 | 0 | 0 | 1 |
| 13 | 8192 | 547.7225 | 0 | 1 | 1 |
| | | $\pi = 300{,}000.0$ | $\pi = 9.9896$ | $\pi = 999.96$ | $\pi = 99{,}942.13$ |

TABLE 2

| n | $A^{2^n}$ | Value |
|---|---|---|
| 1 | $e^{1/4096}$ | 1.0002 |
| 2 | $e^{1/2048}$ | 1.0005 |
| 3 | $e^{1/1012}$ | 1.0010 |
| 4 | $e^{1/512}$ | 1.0020 |
| 5 | $e^{1/256}$ | 1.0039 |
| 6 | $e^{1/128}$ | 1.0078 |
| 7 | $e^{1/64}$ | 1.0157 |

TABLE 2-continued

| n | $A^{2^n}$ | Value |
|---|---|---|
| 8 | $e^{1/32}$ | 1.0317 |
| 9 | $e^{1/16}$ | 1.0645 |
| 10 | $e^{1/8}$ | 1.1331 |
| 11 | $e^{1/4}$ | 1.2840 |
| 12 | $e^{1/2}$ | 1.6487 |
| 13 | $e^1$ | 2.7183 |
| 14 | $e^2$ | 7.3891 |
| 15 | $e^4$ | 54.5982 |

TABLE 3

| B-13 | B-12 | B-11 | Attenuation | Amplification |
|---|---|---|---|---|
| 1 | 0 | 1 | $1/a^2$ | $a^3$ |
| 1 | 0 | 0 | $1/a^2$ | $a^2$ |
| 0 | 1 | 1 | 1 | $a^2$ |
| 0 | 1 | 0 | 1 | $a$ |
| 0 | 0 | 1 | 1 | 1 |

TABLE 4

| K | EXACT LOGARITHMIC ATTENUATION VALUES | ACTUAL CIRCUIT ATTENUATION VALUES | ERROR |
|---|---|---|---|
| 0 | 1.0000 | 1.0000 | 0 |
| 1/8 | 0.9724924 | 0.9724555 | 0.0038% |
| 1/4 | 0.945741 | 0.9457005 | 0.0043% |
| 3/8 | 0.9197265 | 0.9197016 | 0.0027% |
| 1/2 | 0.8944271 | 0.8944271 | 0 |
| 5/8 | 0.8698237 | 0.8698472 | −0.0027% |
| 3/4 | 0.8458970 | 0.8459336 | −0.0043% |
| 7/8 | 0.8226284 | 0.8226597 | −0.0038% |
| 1 | 0.8000 | 0.8000 | 0 |

What is claimed is:

1. A logarithmic digital-to-analog converter for receiving a digital input signal and for providing as an output an analog signal representative of the antilogarithm of the digital input signal comprising:

a first reference source to produce a first reference input signal;

a linear digital-to-analog converter having a digital input to receive a digital input signal, a reference input to receive a first reference input signal, an output terminal providing an output signal proportional to said digital input signal and said first reference input signal, a complement output terminal providing a complement output signal inversely proportional to said digital input signal and proportional to said first reference input signal wherein a sum of said output signal and said complement output signal is proportional only to said reference input signal, said complement output being connected to said first input source wherein said complement output signal affects said first reference input signal;

a second reference source to produce a second reference input signal;

a summing amplifier means having an input to receive said first output signal and said second reference signal and to produce at an output a logarithmic analog output signal, said logarithmic analog output signal related to said first reference input signal and logarithmically related to said digital input signal;

wherein said complement output signal comprises a complement current;

said reference input further comprises a normally grounded input responsive to a feedback voltage and a forced input terminal operable by said summing amplifier to be maintained at a voltage substantially equal to said normally grounded input feedback voltage; and said first reference source further comprises a first reference voltage, a first resistor connecting said first reference voltage and said forced input, a second resistor connecting common ground to said complement output signal and said normally grounded input thereat forming said feedback voltage.

2. A converter of claim 1 wherein:

said first output signal comprises an output current; and said summing amplifier input comprising a non-inverting input connected to common ground, and an inverting input, said summing amplifier including a third resistor connected to said logarithmic analog output and said inverting input forming a logarithmic feedback current path, a fourth resistor connected to said second reference source forming a second reference current path, said output terminal and said inverting input being connected together and receiving said second reference current, said logarithmic analog output signal being determined according to the sum of said output current, said logarithmic feedback current, and said reference current.

3. A converter of claim 2 wherein:

said first reference voltage and said second reference voltage are equal and have a value $V_r$;

said third resistor and said fourth resistor are equal and have a value $R_3$; said first resistor has a value $R_1$;

said second resistor has a value $R_2$;

said digital input has a value K between 0 and 1; and said logarithmic magnitude $V_o$ in relation to $V_r$ being defined as:

$$\frac{V_o}{V_r} = \left[ 1 - \frac{KR_3}{R1 - (1-K)R2} \right].$$

* * * * *

UNITED STATES PATENT AND TRADEMARK OFFICE
CERTIFICATE OF CORRECTION

PATENT NO. : 4,350,974
DATED : September 21, 1982
INVENTOR(S) : Bernard M. Gordon and Hans J. Weedon It is certified that error appears in the above-identified patent and that said Letters Patent are hereby corrected as shown below:

Column 2, line 51, "8.192" should read --8,192--;
Column 2, line 62, "$G^x = \sum_{n=1}^{N} A^{a_n 2^n}$" should read --$G^x = \prod_{n=1}^{N} A^{a_n 2^n}$--;

Column 5, line 13, "e" should read --$\underline{e}$--;
Column 5, line 16, "reaised" should read --raised--;
Column 5, line 54, "a." should read --$\underline{a}$.--;
Column 5, line 62, "a," should read --$\underline{a}$,--;
Column 5, line 63, "a." should read --$\underline{a}$.--;
Column 5, line 66, "a," should read --$\underline{a}$,--;

Column 5, line 66, "$a^2$," should read --$\underline{a}^2$,--;
Column 5, line 67, "$a^3$." should read --$\underline{a}^3$.--;
Column 6, line 19, "anti-log" should read --<u>anti-log</u>--;

Column 6, line 46, "$a^2$," should read --$\underline{a}^2$,--;
Column 6, line 46, "a" should read --$\underline{a}$--;
Column 6, line 59, "resistors 110 and 142" should read --resistors 142 and 144--;
Column 6, line 63, "$a^2$." should read --$\underline{a}^2$.--;

UNITED STATES PATENT AND TRADEMARK OFFICE
CERTIFICATE OF CORRECTION

PATENT NO. : 4,350,974

DATED : September 21, 1982

INVENTOR(S) : Bernard M. Gordon and Hans J. Weedon

It is certified that error appears in the above—identified patent and that said Letters Patent is hereby corrected as shown below:

Column 7, line 4, "$a^2$." should read --$\underline{a}^2$.--;
Column 7, line 6, "$1/a^2$" should read --$1/\underline{a}^2$--;
Column 7, line 8, "$a^4$." should read --$\underline{a}^4$.--;
Column 7, line 19, "$a^2$" should read --$\underline{a}^2$--;
Column 9, line 17, "FEt" should read --FET--;
Column 11, line 62, "$a^{1/8}$," should read --$\underline{a}^{1/8}$,--;
Column 11, line 63, "a" should read --$\underline{a}$--;
Column 11, line 64, "a" should read --$\underline{a}$--;
Column 11, line 64, "$a^{1/8}$" should read --$\underline{a}^{1/8}$--;
Column 11, line 65, "a" should read --$\underline{a}$--;
Column 12, lines 37-38, "circuitry known." should read --circuitry previously known.--;
Column 14, line 46, "said first"... should start a new paragraph.

Signed and Sealed this

Twelfth Day of April 1983

[SEAL]

Attest:

GERALD J. MOSSINGHOFF

Attesting Officer    Commissioner of Patents and Trademarks